(12) United States Patent
Watanabe

(10) Patent No.: US 8,785,240 B2
(45) Date of Patent: Jul. 22, 2014

(54) LIGHT-EMITTING APPARATUS AND PRODUCTION METHOD THEREOF

(75) Inventor: Tomohiro Watanabe, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 82 days.

(21) Appl. No.: 12/530,638

(22) PCT Filed: Apr. 3, 2008

(86) PCT No.: PCT/JP2008/057047
§ 371 (c)(1),
(2), (4) Date: Sep. 10, 2009

(87) PCT Pub. No.: WO2008/126879
PCT Pub. Date: Oct. 23, 2008

(65) Prior Publication Data
US 2010/0084648 A1    Apr. 8, 2010

(30) Foreign Application Priority Data

Apr. 9, 2007  (JP) .................. 2007-101638
Feb. 18, 2008 (JP) .................. 2008-036044

(51) Int. Cl.
*H01L 29/786* (2006.01)
*H01L 21/30* (2006.01)
*H01L 33/00* (2010.01)
*H01L 29/66* (2006.01)
*H01L 27/12* (2006.01)
*H01L 51/00* (2006.01)
*H01L 51/52* (2006.01)
*H01L 27/32* (2006.01)

(52) U.S. Cl.
CPC ......... *H01L 29/7869* (2013.01); *H01L 51/0026* (2013.01); *H01L 29/66742* (2013.01); *H01L 29/78606* (2013.01); *H01L 51/0037* (2013.01); *H01L 51/5237* (2013.01); *H01L 27/1214* (2013.01); *H01L 27/3262* (2013.01)

USPC ........... 438/104; 438/144; 438/149; 438/151; 438/152

(58) Field of Classification Search
USPC ............................................. 257/43; 438/308
See application file for complete search history.

(56) References Cited

U.S. PATENT DOCUMENTS

| 6,633,121 | B2 | 10/2003 | Eida et al. .................... 313/504 |
| 7,674,650 | B2 | 3/2010 | Akimoto et al. | |

(Continued)

FOREIGN PATENT DOCUMENTS

| JP | 2002-132185 | 5/2002 |
| JP | 2002-185009 | 6/2002 |

(Continued)

OTHER PUBLICATIONS

R.L. Hoffman et al., "ZnO-based transparent thin-film transistors," Applied Physics Letters, vol. 82, No. 5, Feb. 3, 2003, pp. 733-735.

(Continued)

*Primary Examiner* — Colleen Matthews
*Assistant Examiner* — William Harriston
(74) *Attorney, Agent, or Firm* — Fitzpatrick, Cella, Harper & Scinto

(57) ABSTRACT

Provided is a method of producing a light-emitting apparatus having a field effect transistor for driving an organic EL device, the field effect transistor including an oxide semiconductor containing at least one element selected from In and Zn, the method including the steps of: forming a field effect transistor on a substrate; forming an insulating layer; forming a lower electrode on the insulating layer; forming an organic layer for constituting an organic EL device on the lower electrode; forming an upper electrode on the organic layer; and after the step of forming the semiconductor layer of the field effect transistor and before the step of forming the organic layer, performing heat treatment such that an amount of a component that is desorbable as $H_2O$ from the field effect transistor during the step of forming the organic layer is less than $10^{-5}$ g/m$^2$.

6 Claims, 4 Drawing Sheets

(56) References Cited

U.S. PATENT DOCUMENTS

| | | |
|---|---|---|
| 7,732,819 B2 | 6/2010 | Akimoto et al. |
| 7,733,015 B2 | 6/2010 | Saito |
| 7,910,490 B2 | 3/2011 | Akimoto et al. |
| 7,932,521 B2 | 4/2011 | Akimoto et al. |
| 2001/0050532 A1 | 12/2001 | Eida et al. |
| 2006/0183274 A1* | 8/2006 | Carcia et al. ............ 438/149 |
| 2007/0046191 A1* | 3/2007 | Saito ...................... 313/506 |
| 2007/0052025 A1 | 3/2007 | Yabuta .................... 257/347 |
| 2007/0072439 A1 | 3/2007 | Akimoto et al. ......... 438/795 |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0239335 A1 | 9/2009 | Akimoto et al. |
| 2009/0305461 A1 | 12/2009 | Akimoto et al. |
| 2010/0136743 A1 | 6/2010 | Akimoto et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0163311 A1 | 7/2011 | Akimoto et al. |

FOREIGN PATENT DOCUMENTS

| | | |
|---|---|---|
| JP | 2003-133309 | 5/2003 |
| JP | 2006-080495 | 3/2006 |
| JP | 2007-059128 A | 3/2007 |
| JP | 2007-073559 | 3/2007 |
| JP | 1 770 788 A2 | 4/2007 |
| TW | I236859 B | 7/2005 |

OTHER PUBLICATIONS

K. Nomura et al., "Room-temperature fabrication of transparent flexible thin-film transistors using amorphous oxide semiconductors," Letters to Nature, vol. 432, Nov. 25, 2004, pp. 488-492.

P. Görrn et al., "Towards See-Through Displays: Fully Transparent Thin-Film Transistors Driving Transparent Organic Light-Emitting Diodes**," Advance Materials, vol. 18, No. 6, Mar. 17, 2006, pp. 738-741.

International Preliminary Report on Patentability issued in PCT/JP2008/057047 on Oct. 22, 2007, 8 pages.

Japanese Office Action issued in the counterpart application No. 2008-036044 dated May 30, 2012, along with its English-language translation—5 pages.

Taiwanese Office Action issued in the counterpart application No. 097112690 dated Jun. 5, 2012, along with its English-language translation—14 pages.

Taiwanese Office Action issued in counterpart application No. 097112690 dated Sep. 14, 2012, along with its English-language translation—11 pages.

Taiwanese Office Action issued in counterpart application No. 097112690 dated Feb. 4, 2013, along with its English-language translation—11 pages.

Taiwanese Office Action issued in counterpart application No. 097112690 dated Nov. 8, 2013, along with its English-language translation—5 pages.

* cited by examiner

LIGHT-EMITTING APPARATUS AND PRODUCTION METHOD THEREOF

TECHNICAL FIELD

The present invention relates to a light-emitting apparatus and a method of producing the apparatus, in particular, a light-emitting apparatus using a field effect transistor as a switching device and typically obtained by stacking an organic EL device on the same substrate as the substrate on which the transistor is formed, and a method of producing the apparatus.

BACKGROUND ART

The so-called active matrix system in which field effect transistors formed on a substrate are used has been adopted as one system according to which an organic EL panel is driven.

In this system, because the luminance of an organic EL device is controlled with a current, a field effect transistor the mobility of which is so large that a sufficient current can be flowed therein is suitably used.

At present, for example, an amorphous Si semiconductor, a polycrystalline Si semiconductor, or an organic semiconductor has been used in a field effect transistor. However, the amorphous Si semiconductor and the organic semiconductor each have a low mobility. In addition, the polycrystalline Si semiconductor is difficult to increase the area thereof and necessitates a high cost.

Further, the polycrystalline Si semiconductor has grain boundaries, and the characteristics of a device formed thereof will vary owing to carrier scattering, so that a circuit for suppressing the luminance unevenness of the device is separately required to be provided, and the requirement is responsible for an additional increase in the production cost and a reduction in the aperture ratio of the device.

Meanwhile, a system using a conductive oxide as a main component such as a Zn—O system (oxide containing at least Zn) has been vigorously developed as a material for the semiconductor layer of a field effect transistor in recent years (Applied Physics Letters, Vol. 82, pp. 733-735 (2003)).

An oxide semiconductor has a higher mobility than that of the amorphous Si semiconductor, can be formed into a film at a low temperature, and is available at a low cost. Attempts have been made to develop a flexible transistor by forming the oxide semiconductor on a flexible substrate.

In addition, because the oxide semiconductor is transparent to visible light, an improvement in aperture ratio of a device obtained by combining the oxide semiconductor and a light-emitting device can be achieved. The development of an organic EL panel according to an active matrix system obtained by combining a TFT (hereinafter referred to as "TOS-TFT") using a transparent oxide semiconductor (hereinafter referred to as "TOS") and an organic EL device has been desired.

Further, an In—Ga—Zn—O system (oxide containing In, Ga, and Zn) (Nature, Vol. 432, pp. 488-492 (2004)) and a Zn—Sn—O system (oxide containing Zn and Sn) are each an amorphous TOS-TFT. In addition, because the amorphous TOS-TFT is theoretically free of carrier scattering which is of concern in a polycrystalline semiconductor, a device using such an amorphous TOS-TFT is expected to have a further increased aperture ratio.

Advanced Materials, Vol. 18, pp. 738-741 (2006) by P. Gorrn et al. discloses a technology for stacking a TOS-TFT of a Zn—Sn—O system (oxide containing Zn and Sn) and an organic EL device on the same substrate.

On the other hand, it has been known that the lifetime of an organic EL device is remarkably reduced owing to the presence of even a trace amount of moisture. In view of the foregoing, the adsorption of moisture is suppressed by covering the entirety of the organic EL device with, for example, a resin or by sealing the device in a layer provided with a moisture adsorbent. Reductions in cost for the production of an organic EL panel and in thickness of the organic EL panel by the sealing of the organic EL device with a solid thin film as a water vapor barrier film will be required to be realized in the future.

U.S. Pat. No. 6,633,121 discloses an organic EL display apparatus in which the water content of each of an organic light-emitting medium, an interlayer insulating film, a color filter, a fluorescent medium, and a planarizing layer is set to 0.05 wt % or less to suppress the generation of a non-light-emitting region, and a method of producing the apparatus.

The production method involving reducing the water content includes performing a dehydration step before and after the formation of an organic light-emitting medium, or alternatively either before or after the formation of the organic light-emitting medium.

The techniques for the dehydration step includes, for example, dew point adjustment, vacuum degree adjustment, inert gas introduction, heat treatment, or a combination of thereof.

The temperature for the heat treatment is desirably 60° C. or more at which the dehydration efficiency is not remarkably reduced, and is desirably 300° C. or less at which an organic film such as an organic light-emitting medium or a fluorescent medium is not thermally damaged.

The period of time for which the heat treatment is performed is influenced by the area and film thickness of a color filter, a fluorescent medium, an interlayer insulating film, or the like but is preferably within the range of 10 minutes to 12 hours. The reason for this is that a dehydration time of less than 10 minutes results in an insufficient dehydration treatment, so that it may be difficult to reduce the water content of an organic light-emitting medium after the assembly to 0.05 wt % or less, and further that a dehydration time in excess of 12 hours merely lengthens the time period for the heat treatment and the effect exerted by more than 12 hours of heat treatment may be not different from that exerted by 12 hours or less of heat treatment.

In view of the foregoing, the dehydration time is more preferably within the range of 30 minutes to 10 hours, or still more preferably within the range of 1 to 6 hours.

In addition, Japanese Patent Application Laid-Open No. 2006-080495 discloses a technology for removing moisture adsorbing to the inside or surface of an insulating film by performing a heat treatment under the atmospheric pressure at 200 to 350° C. and under a reduced pressure at 200 to 400° C., preferably 250 to 350° C. before the formation of an organic layer. Polycrystalline Si is used for a semiconductor layer.

In the case where an insulating film is used as a water vapor barrier film, when a resin film having low heat resistance or the like is used as a flexible substrate or when an attempt to reduce the cost for a production process is to be made, the water vapor barrier film needs to be formed by a lower temperature process.

However, the water vapor barrier property of an insulating film tends to be reduced owing to the film formation at the lower temperature, with the result that a sufficient effect is hardly obtained. The reason is considered that when film formation is performed by a low temperature process (for example, 300° C. or less), it becomes difficult to form a dense film.

In addition, because the respective constituent layers need to be formed at a low temperature of 300° C. or less owing to constraints by the heat resistance of the substrate, the amount of moisture adsorbing to the inside or surface of each constituent layer of a TFT becomes large as compared to that in the case where the layer is formed at a high temperature.

On the other hand, an oxide generally has higher polarization property than that of amorphous Si or polycrystalline Si, so that there is a tendency for the oxide to be extremely liable to adsorb moisture. The tendency becomes remarkable when the film formation is performed at a low temperature. For example, an element showing high polarization property when turned into an oxide like Indium (In) used in the oxide semiconductor in the present invention shows a strong tendency to have high hygroscopic property, so that the amount of moisture adsorbing to the surface thereof is extremely large as compared to that in the case of an amorphous Si semiconductor or a polycrystalline Si semiconductor. Further, when the semiconductor layer is formed of an oxide, the layer contains a large amount of OH groups in the film itself, in addition to the component as water molecules adsorbing to its surface. Because the OH groups can be desorbed as water molecules at the time of heating, merely reducing the content contained in the form of water molecules in the film is not sufficient for the prevention of the degradation of an organic EL device. That is, in the case of an oxide semiconductor layer, it is difficult to prevent the degradation of an organic EL device effectively by merely managing the amount of moisture (component existing in the form of $H_2O$ in the layer) in the layer.

U.S. Pat. No. 6,633,121 discloses a technology for suppressing the generation of a non-light-emitting region in an organic EL display apparatus by setting the water content in each of an organic light-emitting medium, an interlayer insulating film, a color filter, a fluorescent medium, and a planarizing layer to 0.05 wt % or less. However, when an oxide semiconductor is used as the semiconductor layer of a field effect TFT as is the case with the present invention, a large amount of a component is desorbed or diffused as $H_2O$ from the semiconductor layer after the formation of a device, which poses a problem in the longer term. That is, in the case of a film such as of an oxide semiconductor in which OH groups or the like are present, the groups can be desorbed in the form of $H_2O$ at the time of the desorption, so that even when the amount of a component existing in the form of $H_2O$ in the film is small, the groups may substantially have adverse effects comparable to those in the case where the film contains a large amount of moisture in itself. Therefore, it is considered that even when the production method disclosed in U.S. Pat. No. 6,633,121 is applied to an organic EL display apparatus having an oxide semiconductor, because a component that can be desorbed as $H_2O$ with the elapse of time may be present in the film, the application is insufficient to prevent the degradation of the organic EL device over a long period of time.

A possible method of preventing the degradation of an organic EL device due to a component that can be desorbed as $H_2O$ from a TFT using an oxide semiconductor (hereinafter referred to as "OS-TFT") at the time of heating of the OS-TFT is a method involving forming a film having higher water vapor barrier property between the OS-TFT and the organic EL device.

A water vapor permeability required for a water vapor barrier film is said to be less than $10^{-5}$ g/m²/day.

Examples of the film that can satisfy the above-mentioned requirement include a multilayer film obtained by stacking an acrylic resin and aluminum oxide or silicon oxide several times, or a film obtained by alternately stacking SiNx formed into a film by plasma CVD and a plasma-polymerized CNx:H film. However, the films are each formed by a complicated film formation process and necessitate a high production cost.

Accordingly, in order to form an OS-TFT and an organic EL device (typically on the same substrate) by a low temperature process and to give a product having a sufficient lifetime, provision of a costly water vapor barrier layer has been inevitable.

DISCLOSURE OF THE INVENTION

An object of the present invention is to form a display apparatus or the like which has an OS-TFT as a field effect transistor for driving an organic EL device (typically, the device and the OS-TFT are disposed on the same substrate) by a low temperature process, thereby suppressing the degradation of the organic layer at a low cost.

With a view to solving the above-mentioned problems, in the present invention, in a step of forming an organic layer for constituting an organic EL device or a step subsequent thereto, by preventing the desorption and diffusion of moisture from a part which has been formed up to then, the degradation of the organic layer is prevented.

That is, a field effect transistor, an insulating layer, a lower electrode, and a device separation film which have been formed before the formation of the organic layer are treated with heat, so that the remaining amount of a component to be thereafter desorbed and diffused as $H_2O$ is reduced in advance, whereby the degradation of the organic layer is prevented.

Specifically, according to the present invention, there is provided a method of producing a light-emitting apparatus having a field effect transistor for driving an organic EL device, the field effect transistor including an oxide semiconductor containing at least one element selected from In and Zn, the method including the steps of: forming a field effect transistor on a substrate; forming an insulating layer; forming a lower electrode on the insulating layer; forming an organic layer for constituting an organic EL device on the lower electrode; forming an upper electrode on the organic layer; and after a step of forming the semiconductor layer of the field effect transistor and before the step of forming the organic layer, performing heat treatment such that an amount of a component that is desorbable (or releasable) as $H_2O$ from the field effect transistor during the step of forming the organic layer is less than $10^{-5}$ g/m².

Further, the present invention is characterized in that the heat treatment is performed successively after the step of forming the semiconductor layer of the field effect transistor.

Moreover, the present invention is characterized in that the heat treatment is performed successively after the step of forming the field effect transistor.

In addition, the present invention is characterized in that the heat treatment is performed after the step of forming the insulating layer and before the step of forming the organic layer for constituting the organic EL device.

Further, the present invention is characterized in that the field effect transistor includes a source electrode, a drain electrode, the semiconductor layer, a gate electrode, and a gate insulating film; and each of the source electrode, the drain electrode, the semiconductor layer, the gate insulating film, and the gate electrode is formed at a temperature equal to or less than 300° C.

Moreover, the present invention provides a light-emitting apparatus, in which the semiconductor layer includes an oxide containing at least one of In and Zn.

In addition, the present invention provides a light-emitting apparatus, in which the semiconductor layer includes an oxide containing In and Zn, and at least a part of the layer is amorphous.

Furthermore, the present invention provides a light-emitting apparatus, in which then amount of a component that is present in the semiconductor layer after the heat treatment step and is desorbable as $H_2O$ when subjected to heat treatment up to 600° C. is less than $3.0\times10^{-3}$ g/m².

According to the present invention, when a light-emitting apparatus is produced through a low temperature process by stacking an organic EL device on the same substrate as the substrate on which an OS-TFT is formed, the degradation of an organic layer can be suppressed at a low cost.

Further features of the present invention will become apparent from the following description of exemplary embodiments with reference to the attached drawings.

BEST MODE FOR CARRYING OUT THE INVENTION

The present inventors have conducted extensive studies on the relationship between the electrical characteristics of an OS-TFT and the amount of a component that can be desorbed as $H_2O$ from an oxide semiconductor layer of an OS-TFT at the time of heating of the OS-TFT and have confirmed that the OS-TFT operates satisfactorily in a state where the layer contains a some amount (1.0 molecule/nm³ to 1.4 molecules/nm³) of a component that can be desorbed as $H_2O$.

Meanwhile, it has been well known that moisture is responsible for the degradation of an organic EL device, so that a TFT for driving an organic EL device preferably contains a smaller amount of a component that can be desorbed as $H_2O$ at the time of heating.

In view of such circumstances, the present inventors have conducted extensive studies on the electrical characteristics of an OS-TFT when the amount of a component that can be desorbed as $H_2O$ from an oxide semiconductor layer at the time of heating is reduced and have found that such characteristics as to be sufficient for driving an organic EL device can be obtained thereby. In view of the foregoing, the present inventors have accomplished the present invention as a treatment method which is necessary for using an OS-TFT as a TFT for driving an organic EL device.

Hereinafter, the best mode for carrying out the present invention will be described with reference to the attached drawings.

Embodiment 1

In this embodiment, a description is made of a case where OS-TFTs of an amorphous In—Ga—Zn—O system are used as switching devices, and an organic EL display panel according to a typical constitution of the present invention, that is, a constitution in which organic EL devices are stacked on the same substrate as the substrate on which the OS-TFTs are formed is produced. The term "In—Ga—Zn—O system" herein employed refers to an oxide-based material containing at least In, Ga, and Zn.

Figure 1:
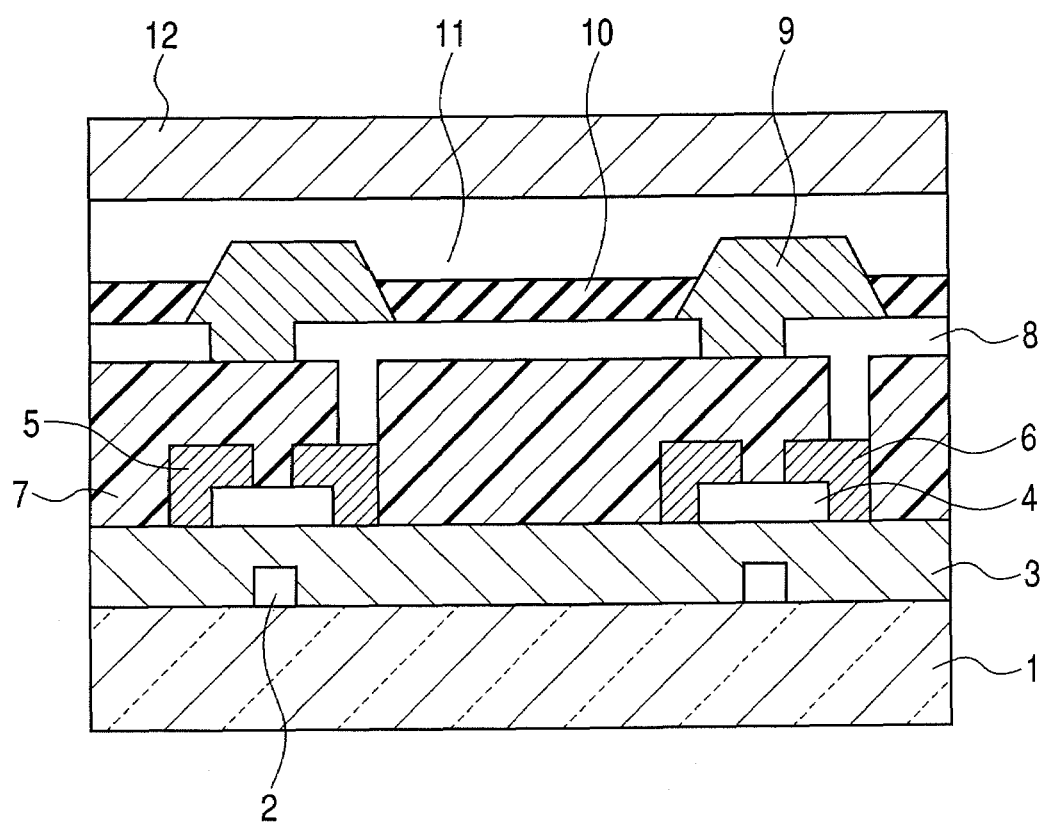
FIG. 1 is a cross-sectional view illustrating a light-emitting apparatus having OS-TFTs and organic EL devices formed on the same substrate as an embodiment of the present invention.

FIG. 1 is a cross-sectional view illustrating the constitution of a light-emitting apparatus as an embodiment of the present invention.

In FIG. 1, reference numeral 1 denotes a glass substrate as a substrate; 2, a gate electrode; 3, a gate insulating layer; 4, an oxide semiconductor layer (semiconductor layer); 5, a drain electrode; 6, a source electrode; 7, an insulating layer; 8, a transparent anode as a lower electrode; 9, a device separation film that can be provided as needed; 10, an organic layer; 11, a metal cathode as an upper electrode; and 12, an insulating layer used as a passivation film.

First, the source electrode 5 and the drain electrode 6 are directly connected to the oxide semiconductor layer (semiconductor layer) 4, and are controlled by the gate electrode 2 through the insulating layer 3. The organic layer 10 is connected to the drain electrode 6 through the lower transparent anode 8 and a contact hole.

The drain electrode 5 or source electrode 6 of the OS-TFT and the electrode of the transparent anode 8 are electrically connected to each other.

The organic layer 10 is constituted of an electron-transporting layer, a light-emitting layer, and a hole-transporting layer, but the constitution of the layer is by no means limited to the foregoing.

The transparent anode 8 is provided below the organic layer 10, and when the OS-TFT is in an ON state, a voltage is applied to the organic layer 10, whereby the layer emits light.

The metal cathode 11 can be changed depending on the purpose of a light-emitting device to be used. For example, when the light-emitting device is of a bottom emission type, a metal electrode is used, and, when light is emitted from the both surfaces of the device, a transparent electrode may be used.

From the viewpoint of increasing the aperture ratio of the device, an insulating substrate, electrodes, an insulating layer, a semiconductor layer, and the like are desirably transparent to the wavelength of visible light.

An oxide containing In, Ga, Zn, Sn, or the like can be formed into any one of an insulator, a semiconductor, and a conductor by changing the composition and the film forming conditions such as oxygen partial pressure.

It is also preferable that a transparent protective film formed of an oxide or an oxynitride be provided between the OS-TFT and the organic layer as needed in order that the OS-TFT may be protected from damage during a process for the formation of the organic layer.

Figure 2:
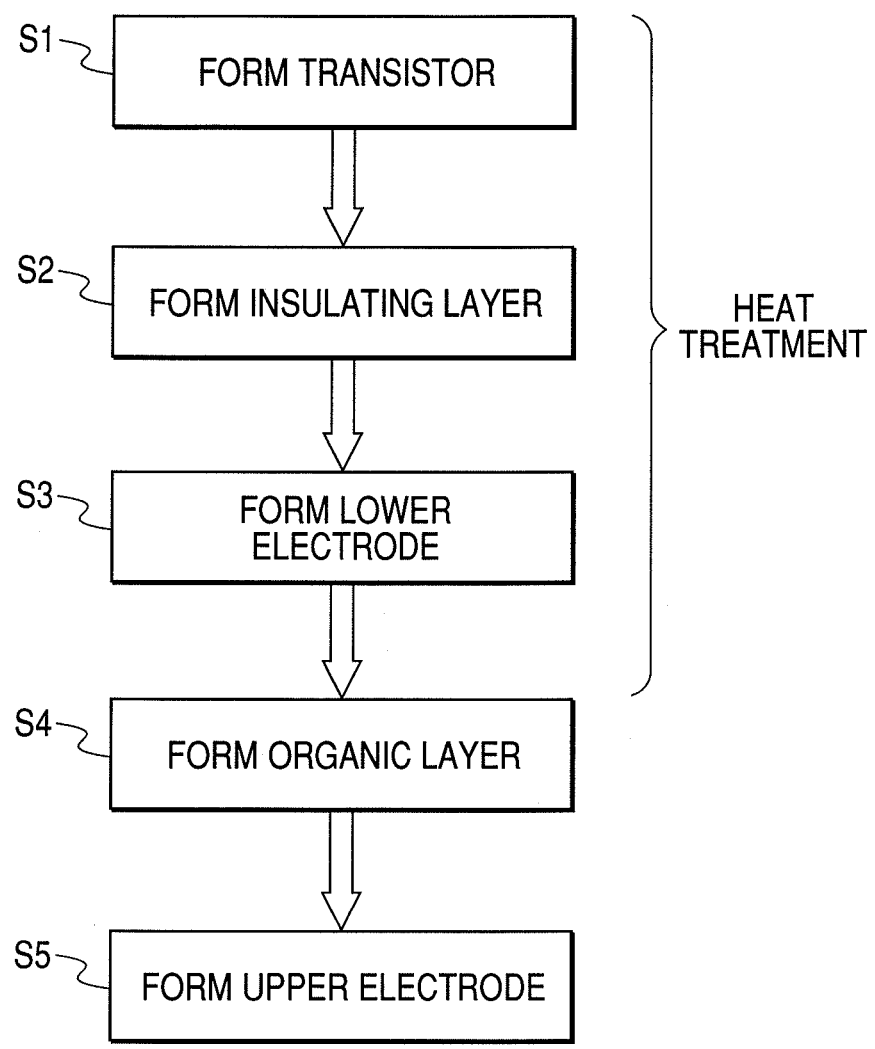
FIG. 2 is a flow chart illustrating a method of producing a light-emitting apparatus as an embodiment of the present invention.

Next, a method of producing a light-emitting apparatus having a field effect transistor for driving an organic EL device in the present invention will be described with reference to FIG. 2.

First, a field effect transistor is formed on a substrate (Step S1). In the case of a bottom gate, top contact transistor, a gate electrode 2 is formed on the substrate 1 by patterning before a gate insulating layer 3 is formed. Next, an oxide semiconductor layer 4 is formed by patterning.

Here, when a process after the formation of the oxide semiconductor layer 4 and before the formation of the organic layer for forming the organic EL device is a dry process, a heat treatment for dehydration is preferably performed successively after the formation of the oxide semiconductor layer 4. The term "successively" as herein employed is not necessarily intended to mean that two steps are consecutive to each other without any instantaneous time interval therebetween but is intended to also mean that the heat treatment for dehydration is performed without through any other step after the step of forming the oxide semiconductor layer 4. Therefore, a standby time after the step of forming the oxide semiconductor layer 4 and before the step of performing the heat treatment for dehydration may be present to such an extent that the characteristics of the oxide semiconductor layer 4 are adversely affected.

As described above, the oxide semiconductor layer 4 containing metal ions having high polarization property tends to be liable to adsorb moisture, and moisture adsorbing to the surface of the layer is diffused in the form of OH group or the like into the layer.

Therefore, in the case where a wet process is present after the formation of the oxide semiconductor layer 4, the layer will adsorb moisture again even when the layer has been once dehydrated. Accordingly, when the method of producing the light-emitting apparatus passes through a process by passing through which the layer may adsorb moisture again, it is preferred that the heat treatment for dehydration according to the present invention is performed before the method proceeds to the next process.

In addition, when only dry processes are present during the period of time after the completion of the formation of the oxide semiconductor layer 4 and before the initiation of the formation of the organic layer in Step S4 to be described later, there are many cases where the oxide semiconductor layer 4 may become a layer that has adsorbed moisture to the largest extent. In such cases as well, it is preferred that a heat treatment for dehydration is performed before the method proceeds to the next process.

Next, the drain electrode 5 and the source electrode 6 are each formed by patterning, whereby the field effect transistor is completed.

Next, an insulating layer 7 is formed (Step S2), and a contact hole to the source electrode 6 is formed. After that, a transparent electrode 8 is formed (Step S3), and is joined to the source electrode 6.

Here, when no heat treatment for dehydration is performed immediately after the formation of the oxide semiconductor layer 4, and a heat treatment for dehydration is performed only immediately after the formation of the transparent electrode 8, it is preferred that the heat treatment is performed at 150° C. or more for 30 minutes or more.

In addition, when a device separation film 9 is formed after the formation of the transparent electrode 8, it is preferred that a heat treatment for dehydration is performed at 150° C. or more for 30 minutes or more immediately after the formation of the device separation film 9.

Next, an organic layer 10 for forming the organic EL device is formed on the transparent electrode 8 (Step S4), and a metal cathode 11 is formed on the organic layer 10 (Step S5).

The heat treatment for dehydration does not depend on an atmosphere or a pressure but depends on the conditions at the time of the film formation, so that not only an inert atmosphere such as dry air, nitrogen gas, or a rare gas but also an atmosphere such as oxygen can be used for the treatment.

The heating temperature at the time of the heat treatment according to the present invention is 150° C. to 300° C., or preferably 200° C. to 300° C. In addition, when the temperature is not kept constant but increased, the technical effect of the present invention can be obtained, for example, when the temperature is increased at a rate of 60° C./min with an infrared lamp to reach 150° C.

In any case, when after the heat treatment has been performed, the organic layer is formed at a temperature higher than the temperature of the heat treatment, the effect of the previously performed heat treatment is lost because the amount of a component to be desorbed as $H_2O$ from the field effect transistor becomes $10^{-5}$ $g/m^2$ or more.

Therefore, the temperature at which the heat treatment is performed in the present invention must be equal to or higher than the temperature at which a heat treatment at the time of the formation of the organic layer is performed later.

In any case, such a heat treatment that the amount of a component that can be desorbed as $H_2O$ from the field effect transistor becomes less than $10^{-5}$ $g/m^2$ needs to be performed after the step of forming the semiconductor layer of the field effect transistor and before the step of forming the organic layer (Step S4).

Hereinafter, each component will be described in more detail.

(Substrate)

A glass substrate is generally used in a light-emitting device. A substrate having a surface with such flatness that the arithmetic mean roughness (Ra) is several nanometers or less can be suitably used in this embodiment.

Since the OS-TFT used in the present invention can be formed at a low temperature, a resin substrate which is difficult to use in an active matrix system using a-Si TFTs that generally require a high temperature process can be used.

In this case, in general, a process for the production of a light-emitting layer using such a resin substrate is mainly performed at a temperature up to about 200° C. A temperature up to about 300° C. is applicable to the process depending on the conditions (for example, conditions under which substantially no damage is given to the resin substrate, such as a heat treatment for a short period of time).

The adoption of the resin substrate results in a light-emitting device which has a light weight and which hardly breaks, and the device can be bent to some extent.

In this case, each of the source electrode, the drain electrode, the gate insulating film, the gate electrode, and the semiconductor layer needs to be formed at a temperature from room temperature up to 300° C., desirably a temperature from room temperature up to 200° C.

A transparent substrate can be more suitably employed because the aperture ratio of the device increases.

Of course, a semiconductor substrate formed of, for example, Si or a ceramic substrate as well as any such substrate as described above can be utilized. A substrate obtained by providing an insulating layer on a metal substrate can also be utilized as long as the substrate has a flat surface.

(Field Effect Transistor)

In this embodiment, a semiconductor of an In—Zn—O system or a system obtained by adding Ga to the foregoing system is preferably used in a semiconductor layer of a field effect transistor.

A component of this composition of the layer can be replaced with Mg or the like, or Mg or the like can be added to the composition. In such case, however, an electron carrier concentration of less than $10^{18}/cm^3$ and an electron mobility of 1 $cm^2/(V \cdot sec)$ or more needs to be achieved.

According to the findings of the present inventors, when a semiconductor of an In—Ga—Zn—O system is used in a semiconductor layer, the characteristics have been observed in which the moisture inside the layer is hardly desorbed up to a temperature at which heat treatment has been performed once.

Figure 3:
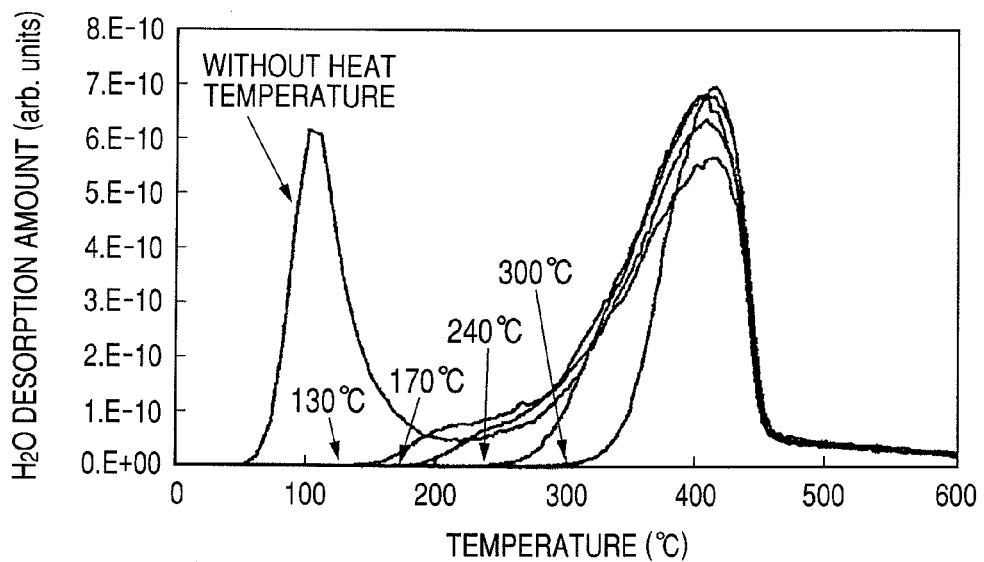
FIG. 3 is a graphical representation illustrating temperature programmed desorption curves of a transparent oxide semiconductor as an embodiment of the present invention.

FIG. 3 is a graphical representation illustrating the results of the temperature programmed desorption analysis of a semiconductor film of an In—Ga—Zn—O system formed at room temperature.

In FIG. 3, the ordinate indicates the desorption amount of $H_2O$ molecules, and the abscissa indicates the temperature of a thermocouple brought into contact with the surface of the semiconductor film of the In—Ga—Zn—O system during the temperature programmed desorption analysis, and the temperature indicated by an arrow represents the heat treatment temperature.

In the case of a sample not subjected to a heat treatment, a peak of the desorption amount of moisture adsorbing to the surface of the film is observed at or near 110° C. On the other hand, in the case of a sample subjected to a heat treatment, it can be found that the desorption of moisture is significantly reduced at a temperature equal to or less than the temperature at which the heat treatment was performed. Therefore, the desorption amount of moisture from the semiconductor film of the In—Ga—Zn—O system can be controlled by a heat treatment. When it is required to reduce the desorption amount of moisture from the semiconductor film of the In—Ga—Zn—O system during the process for the formation of the organic layer, moisture is desorbed from the semiconductor film of the In—Ga—Zn—O system by heat-treating the film before the formation of the organic layer. As the heat treatment conditions for releasing moisture, by employing a temperature higher than the process temperature used in the process for the formation of the organic layer, the desorption of moisture from the semiconductor film of the In—Ga—Zn—O system can be effectively suppressed.

The higher the heat treatment temperature, the larger the extent to which the desorption amount of moisture from the semiconductor film of the In—Ga—Zn—O system is reduced. However, because the heat treatment involves changes in the quality and carrier concentration of the semiconductor film of the In—Ga—Zn—O system, a heat treatment temperature up to about 300° C. is preferable.

Figure 4:
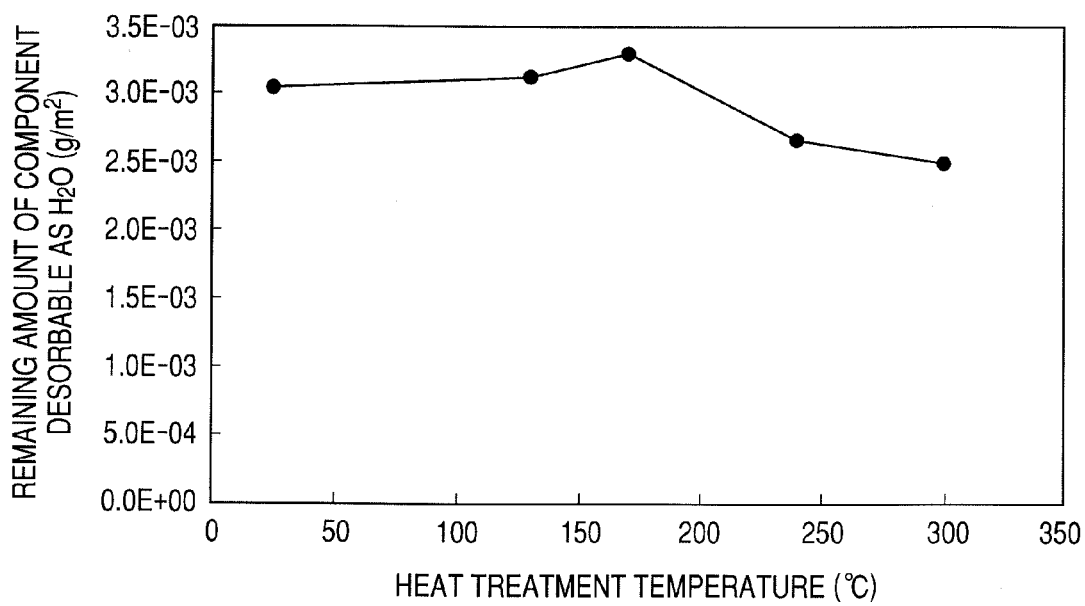
FIG. 4 is a graphical representation illustrating a relationship between the heat treatment temperature for a transparent oxide semiconductor and the remaining amount of a component that can be desorbed as $H_2O$ as an embodiment of the present invention.

FIG. 4 is a graphical representation illustrating the relationship between a heat treatment temperature and the amount of a component which remains in the semiconductor film of the In—Ga—Zn—O system after the heat treatment and can be desorbed as $H_2O$. The point indicated at the leftmost end in the graph corresponds to a sample not subjected to a heat treatment. The term "a component which remains in the semiconductor film of the In—Ga—Zn—O system after the heat treatment and can be desorbed as $H_2O$" herein employed refers to a component that still remains in the semiconductor film even after the heat treatment for dehydration has been performed. The term is intended to encompass not only a component which is present in the form of $H_2O$ in the semiconductor film but also a component which is present in the form of, for example, OH groups and can be desorbed in the form of $H_2O$ when the film is heat-treated up to 600° C.

It can be seen from the graphical representation that the remaining amount of the component that can be desorbed as $H_2O$ in each of the samples, respectively, subjected to heat treatment at 130° C. ($3.1 \times 10^{-3}$ $g/m^2$) and 170° C. ($3.3 \times 10^{-3}$ $g/m^2$) is larger than that in the sample not subjected to heat treatment ($3.0 \times 10^{-3}$ $g/m^2$). Although the foregoing fact seems to be in contradiction to a relationship between a heat treatment and a residual component, possible reasons for the contradiction are as described below. One possible reason is that $H_2O$ molecules or OH groups adsorbing to the surface of the semiconductor film of the In—Ga—Zn—O system have been diffused into the semiconductor film when the temperature of the film is increased up to 130° C. for the heat treatment. Another possible reason is that a component that can be desorbed as H or $H_2$ when not subjected to heat treatment has changed into a component that can be desorbed as $H_2O$ (i.e., the bonding state has changed) by the heat treatment. The foregoing is sustained by the fact that, in FIG. 3, the desorption amount of moisture from each of the samples, respectively, subjected to heat treatment at 130° C. and 170° C. is larger than that from the sample not subjected to heat treatment at temperatures higher than about 200° C. Therefore, it is considered as follows. That is, the remaining amount of a component that can be desorbed as $H_2O$ has increased, but the component has changed into such a form that the component is not desorbed unless the temperature of the component becomes higher than the temperature at which the heat treatment was performed, so that the component may not be desorbed when the film is heat-treated up to the same temperature again.

In contrast, it can be seen that the remaining amount of the component that can be desorbed as $H_2O$ in each of the samples subjected to the heat treatment at 240° C. or more is much lower than that in the sample not subjected to a heat treatment. This is probably because the temperature of 240° C. is equal to or more than the temperature at which even the above-mentioned "such a form that the component is not desorbed as $H_2O$ unless the temperature becomes higher than the heat treatment temperature" is desorbed. The amount of a component which remains in the sample subjected to the heat treatment at 240° C. and can be desorbed as $H_2O$ is $2.7 \times 10^{-3}$ $g/m^2$. As described above, the heat treatment temperature may have only to fall within the range of 150° C. to 300° C. However, in order that the diffusion of moisture may be prevented over a long period of time, it is preferred that the amount of the component which remains in the semiconductor layer and can be desorbed as $H_2O$ is smaller. In view of the foregoing, the preferable heat treatment temperature is such that the amount of a component which remains in the semiconductor layer and can be desorbed as $H_2O$ is less than that in a sample not subjected to a heat treatment. Therefore, with reference to FIG. 4, the temperature can be considered to be the temperature at a point on a straight line connecting the points at 170° C. and 240° C. at which the remaining amount of the component desorbable as $H_2O$ is equal to that ($3.0 \times 10^{-3}$ $g/m^2$) of the sample not subjected to a heat treatment, and the temperature determined on the basis of the above consideration is about 200° C. (calculated: 202° C.) when the measurement accuracy of the temperature and remaining amount is taken into consideration. In view of the foregoing, the heat treatment temperature is preferably more than 200° C., and more preferably more than 202° C. In addition, the amount of a component which remains in the semiconductor layer and can be desorbed as $H_2O$ is preferably less than $3.0 \times 10^{-3}$ $g/m^2$.

In addition, a transparent semiconductor layer is more suitable because the aperture ratio of the device increases.

A sputtering method or a pulse laser vapor deposition method is suitable for the formation of the semiconductor layer. Use of various sputtering methods advantageous for improving the productivity is more suitable. It is also effective to additionally provide a buffer layer between the semiconductor layer and the substrate appropriately.

For the material of the gate insulating film, any one kind of $Al_2O_3$, $Y_2O_3$, $SiO_2$, $SiN_x$, and $HfO_2$, or a mixed crystal compound containing at least two kinds of these compounds can preferably be used. However, the preferable compound for the gate insulating film is not limited to those described above.

An insulating film of an In—Zn—O system or a system obtained by adding Ga to the foregoing system is more preferable.

As is the case with the above semiconductor film of the In—Ga—Zn—O system, by controlling the film forming conditions, it is possible to provide an insulating film in which the moisture in the film is hardly desorbed at a temperature equal to or less than the temperature at which the film has been heat-treated once. A transparent insulating film is more suitable because the aperture ratio of the device increases.

Examples of the material for each of the source electrode, the drain electrode, and the gate electrode include Au, Ti, Ni, In, Sn, Zn, Cu, or Ag, or an alloy or oxide containing at least one of them.

A conductive film of an In—Zn—O system or a system obtained by adding Ga to the foregoing system can also be adopted as a material for each of the source electrode, the drain electrode, and the gate electrode.

As is the case with the above semiconductor film of the In—Ga—Zn—O system, by controlling the film forming conditions, it is possible to provide an electrode in which the moisture in the electrode is hardly desorbed at a temperature equal to or less than the temperature at which the electrode has been heat-treated once.

(Organic Layer)

The organic layer 10 used in this embodiment is generally formed of a plurality of layers as follows:

a two-layer structure composed of hole-transporting layer/light-emitting layer+electron-transporting layer (which means a light-emitting layer having an electron-transporting function);

a three-layer structure composed of hole-transporting layer/light-emitting layer/electron-transporting layer;

a four-layer structure composed of hole injection layer/hole-transporting layer/light-emitting layer/electron-transporting layer;

a five-layer structure composed of hole injection layer/hole-transporting layer/light-emitting layer/electron-transporting layer/electron-injecting layer".

In addition to the foregoing, an electron barrier layer, an adhesion improving layer, or the like may also be additionally provided.

For the light-emitting layer portion, either one of fluorescence or phosphorescence may be used, but the use of phosphorescence is more effective from the viewpoint of a higher emission efficiency. As a phosphorescent material, an iridium complex is useful. In addition, both of low molecular weight molecules and high molecular weight molecules can be utilized. Generally, the low molecular weight molecules can be formed into a film by a vapor deposition method, while the high molecular weight molecules can be formed into a film by a ink jet or printing method.

Examples of the low molecular weight molecule include amine complexes, anthracenes, rare earth complexes, and noble metal complexes. Examples of the high molecular weight molecule include a n-conjugated system and a dye-containing polymer.

Examples of the material of the electron injection layer include an alkali metal, an alkaline earth metal, a compound containing such a metal, and an organic substance doped with an alkali metal. In addition, examples of the material of the electron-transporting layer include aluminium complexes, oxadiazoles, triazoles, and phenanthrolines.

Examples of the material for the hole injection layer include arylamines, phthalocyanines, and organic substances doped with a Lewis acid. The hole-transporting layer may be, for example, an arylamine.

The drying of a hole-transporting layer is often a process to be performed at the highest temperature during the formation of an organic layer except the formation of a device separation film.

In the case of poly(3,4-ethylenedioxythiophene):poly(styrenesulfonate) (hereinafter referred to as "PEDOT:PSS") as the most representative material for a hole-transporting layer, the layer is dried mainly at a temperature of 120° C. or more. However, when it is required to suppress the degradation of the layer over a long period of time, it is desirable that the layer is dried at a temperature of 150° C. or more.

Therefore, the heat treatment temperature for the field effect transistor is less than 300° C. below which the change in the characteristics of the above semiconductor film of the In—Ga—Zn—O system is small, and is 120° C. or more, desirably 150° C. or more.

(Upper/Lower Electrodes)

The preferable material for each of the upper and lower electrodes varies depending on which one of a two-sided emission type, a top emission type, and a bottom emission type is adopted for the light-emitting device and also on whether the electrode is a cathode or an anode.

(Upper Electrode)

In the two-sided emission type and top emission type light-emitting devices, the upper electrode needs to be transparent. In the case of an organic EL device, the preferable electrode varies depending on the constitution of the device.

For example, when an organic layer to be connected to an upper electrode is an anode, a transparent electrode having a large work function is preferably used as the upper electrode.

Examples of the material of the transparent electrode include ITO, conductive ZnO, and an In—Zn—O system each having an electron carrier concentration of $10^{18}/cm^3$ or more.

Further, an In—Ga—Zn—O system having an electron carrier concentration of $10^{18}/cm^3$ or more can also be utilized. In this case, unlike a TFT, the carrier concentration is preferably as high as possible, and for example, a carrier concentration of $10^{19}/cm^3$ or more is preferable.

In a bottom emission type light-emitting device, the upper electrode does not need to be transparent. Accordingly, when the upper electrode is an anode, an Au alloy, Pt alloy, or the like having a large work function can be utilized, and when the upper electrode is a cathode, Ag-added Mg, Li-added Al, a silicide, a boride, a nitride, or the like can be utilized.

(Lower Electrode)

In the two-sided emission type and bottom emission type light-emitting devices, the lower electrode needs to be transparent.

A preferable production method for the lower electrode is such that a material containing at least one element of In, Ga, and Zn is deposited while the deposition conditions such as an oxygen flow rate are adjusted so that an electron carrier concentration of $10^{18}/cm^3$ or more is attained.

Furthermore, for example, conductive ZnO, an In—Zn—O system, or ITO at least part of which is an amorphous oxide can preferably be used.

Moreover, an In—Ga—Zn—O system having an electron carrier concentration of $10^{18}/cm^3$ or more can also be utilized.

In addition, an alloy doped with an alkali metal or an alkaline earth metal and formed into a film having a thickness of several tens of nanometers or less on the upper portion of a transparent electrode can also be used as the lower electrode.

In the case of the top emission type light-emitting device, the lower electrode does not need to be transparent. Accordingly, when the lower electrode is an anode, an Au alloy, Pt alloy, or the like having a large work function can be utilized, and when the lower electrode is a cathode, Ag-added Mg, Li-added Al, a silicide, a boride, a nitride, or the like can be utilized.

Example

Figure 5:
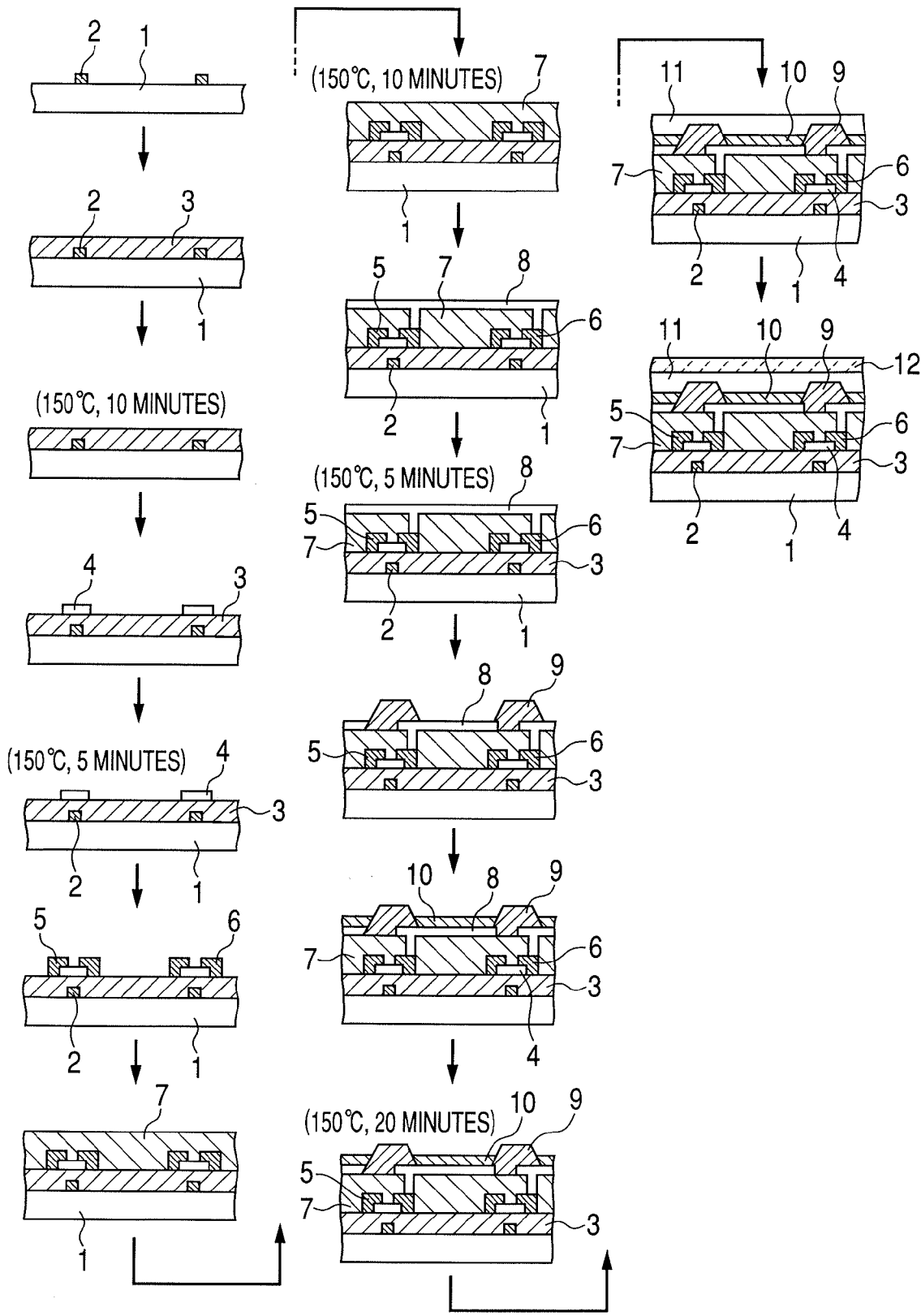
FIG. 5 is a cross-sectional view illustrating a production method of a light-emitting apparatus having OS-TFTs and organic EL devices formed on the same substrate as an embodiment of the present invention.

Hereinafter, an example of a production method in which organic EL devices and OS-TFTs are mounted on the same substrate will be described with reference to FIG. 5. The maximum temperature which can be reached during a process for the formation of the organic EL device is 150° C.

In addition, in order that the device may be prevented from unnecessarily adsorbing moisture owing to exposure to the atmosphere, the device is kept so as not to be brought into contact with the atmosphere by appropriately using, for example, a transfer vessel except during a process utilizing a photolithographic method and a wet process.

(Formation of Field Effect Transistor)

A glass substrate 1 (1737 (trade name); manufactured by Corning Inc.) is selected as a substrate on which a film is to be formed. Before the formation of a film, the substrate is ultrasonically degreased and cleaned sequentially with acetone, IPA, and ultrapure water for 5 minutes each, and is then subjected to a heat treatment for dehydration in air at 150° C. for 10 minutes. At that time, in the case where the dehydration is insufficient, the atmosphere, temperature, or time period of the heat treatment can be changed to such an extent that the surface flatness of the glass substrate is not adversely affected.

The case where the dehydration is insufficient is a case where the amount of a component that can be desorbed as $H_2O$ from the field effect transistor is $10^5$ g/m$^2$ or more at the time of the formation of an organic layer irrespective of whether a heat treatment step for a semiconductor layer is performed.

A patterning for a gate electrode 2 is performed with respect to the glass substrate by a photolithographic method and a wet processing method in advance. Then, Al and Ag are vapor-deposited, respectively, in a film thickness of 150 nm to thereby form the gate electrode 2.

Next, an $SiO_2$ film is formed by a sputtering method as a gate insulating film 3. The sputtering is performed in an atmosphere having an Ar gas flow rate of $2.2 \times 10^{-2}$ Pa·m$^3$/sec and an $O_2$ gas flow rate of $2.0 \times 10^{-3}$ Pa·m$^3$/sec at a pressure of 0.187 Pa while the temperature of the substrate is set to room temperature, and the input power is set to 300 W.

Then, the resultant is subjected to a heat treatment for dehydration in the air at 150° C. for 10 minutes. At that time, in the case where the dehydration is insufficient, the conditions for the heat treatment can be changed as is the case with the glass substrate.

After that, an amorphous oxide semiconductor thin film 4 of an In—Ga—Zn—O system is formed on the patterned substrate by a sputtering method with a polycrystalline sintered body having a composition of $InGaO_3(ZnO)_4$ being used as a target. An available method for the patterning is a photolithographic method or a wet processing method.

At that time, the film is deposited in a thickness of 40 nm in a desired atmosphere containing Ar gas and oxygen gas at a pressure of 0.6 Pa and at room temperature. After that, the resultant is subjected to a heat treatment for dehydration in the air at 150° C. for 5 minutes. At that time, in the case where the dehydration is insufficient, the conditions for the heat treatment can be changed as is the case with the glass substrate.

Here, each of samples before and after the heat treatment is transferred to a temperature programmed desorption spectrometer (EMD-WA 1000S/W (trade name); manufactured by ESCO, Ltd.) by use of a transfer vessel without being exposed to the atmosphere and the measurement is then performed.

The amount of a component that can be desorbed as $H_2O$ from the sample before the heat treatment until the temperature of the sample is increased to 150° C. is $7 \times 10^{-4}$ g/m$^2$, which is more than $10^{-5}$ g/m$^2$.

The amount of a component that can be desorbed as $H_2O$ from the sample after the heat treatment until the temperature of the sample is increased to 150° C. is $3 \times 10^{-6}$ g/m$^2$, which is less than $10^{-5}$ g/m$^2$.

Then, a source electrode 5 and a drain electrode 6 are patterned by a photolithographic method and a wet processing method.

Next, an $SiO_2$ film is formed by a sputtering method as an insulating film 7 under the same conditions as those for the above gate insulating film 3, and the resultant is subjected to a heat treatment in the air at 150° C. for 10 minutes. At that time, in the case where the dehydration is insufficient, the conditions for the heat treatment can be changed as is the case with the glass substrate.

In the above series of processes, each layer is formed to have a desired size by use of a photolithographic method and a dry processing method.

(Formation of Lower Electrode)

Next, ITO is formed into a film having a thickness of 350 nm by a sputtering method, whereby a lower electrode 8 is obtained.

At that time, the source electrode 6 and the lower electrode 8 are connected to each other through a contact hole. After the formation of the film, the resultant is subjected to a heat treatment for dehydration in the air at 150° C. for 5 minutes. At that time, in the case where the dehydration is insufficient, the conditions for the heat treatment can be changed as is the case with the glass substrate.

(Determination of Desorption Amount of Moisture Before Formation of Organic Layer)

A part of the sample that has been subjected to the heat treatment after the formation of the lower electrode 8 is transferred to a temperature programmed desorption spectrometer by use of a transfer vessel without being exposed to the atmosphere and the measurement is performed.

The amount of a component that can be desorbed as $H_2O$ until the temperature of the sample is increased to 150° C. is $8 \times 10^{-6}$ g/m$^2$, which is less than $10^{-5}$ g/m$^2$ and is therefore smaller than the desorption amount of moisture that causes degradation of the organic EL device.

(Formation of Device Separation Film)

A device separation film 9 is formed as needed.

(Formation of Organic Layer)

Next, by using a resistive evaporation method, a tris(8-quinolinol)aluminum film having a thickness of 25 nm is formed as an electron-transporting layer, and a 4,4'-bis(2,2)-diphenylvinyl film having a thickness of 45 nm is formed thereon as a light-emitting layer.

After that, a PEDOT:PSS film having a thickness of 20 nm is formed as a hole-transporting layer. Further, 4,4'-bis[N,N-diamino]-4"-phenyl-triphenylamine is formed thereon as a hole injection layer having a thickness of 55 nm. The electron-transporting layer, the light-emitting layer, the hole-transporting layer, and the hole injection layer together constitute an organic layer 10.

The formation of the PEDOT:PSS film is performed at the highest temperature during the formation of the organic layer 10, and involves spin coating at 60° C. and at 4,000 rpm, followed by drying in the air at 150° C. for 20 minutes.

(Formation of Upper Electrode)

By using a co-evaporation method, an alloy of Al and Ag is formed into a film having a thickness of 50 nm, and Al is formed into a film having a thickness of 50 nm, whereby an upper electrode 11 is obtained.

The above-mentioned device is driven by bringing a probe into contact with the device. As a result, the device emits blue light from the rear side of the substrate, that is, in a bottom emission type.

(Formation of Passivation Film)

A passivation film 12 is further formed thereon as needed.

Comparative Example

In the present comparative example, an amorphous oxide semiconductor thin film 4 of an In—Ga—Zn—O system is formed by following the same procedure as Example above. The thus formed amorphous oxide semiconductor thin film 4 is not subjected to a moisture desorption treatment and subjected, before the formation of the organic layer, to a temperature programmed desorption analysis. As a result, the amount of a component that can be desorbed as $H_2O$ until the temperature of the sample is increased to 150° C. is $9 \times 10^{-4}$ $g/m^2$ or more, which significantly exceeds $10^{-5}$ $g/m^2$.

Therefore, when the organic layer is formed on the TFT produced in the comparative example, the desorption of moisture is caused during the step of forming the organic layer, thereby resulting in the degradation of the characteristics of the organic layer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications Nos. 2007-101638, filed Apr. 9, 2007 and 2008-036044, filed Feb. 18, 2008, which are hereby incorporated by reference herein in their entirety.

The invention claimed is:

1. A method of producing a light-emitting apparatus having a field effect transistor for driving an organic EL device, the field effect transistor comprising an oxide semiconductor layer containing at least one element selected from In and Zn, the method comprising the steps of:
    forming a field effect transistor on a substrate;
    forming an insulating layer;
    forming a lower electrode on the insulating layer;
    forming an organic layer containing at least a light-emitting layer for constituting an organic EL device on the lower electrode; and
    forming an upper electrode on the organic layer,
    wherein the step of forming the field effect transistor comprises a step of forming the oxide semiconductor layer, and a heat treatment step for dehydration performed successively after the forming of the oxide semiconductor layer.

2. The method according to claim 1, further comprising a second heat treatment step, and the second heat treatment step is performed after the step of forming the insulating layer and before the step of forming the organic layer for constituting the organic EL device.

3. The method according to claim 1, wherein the field effect transistor comprises a source electrode, a drain electrode, the semiconductor layer, a gate electrode, and a gate insulating film, and wherein the source electrode, the drain electrode, the semiconductor layer, the gate insulating film, and the gate electrode are each formed at a temperature of 300° C. or less.

4. A light-emitting apparatus produced by the method set forth in claim 1, wherein the oxide semiconductor layer comprises an oxide at least a part of which is amorphous.

5. The light-emitting apparatus according to claim 4, wherein an amount of a component that is present in the oxide semiconductor layer after the heat treatment step and is desorbable as $H_2O$ when subjected to heat treatment up to 600° C. is less than $3.0 \times 10^{-3}$ $g/m^2$.

6. The method according to claim 1, wherein the heat treatment step is performed such that an amount of a component that is desorbable as $H_2O$ from the oxide semiconductor layer during the step of forming the organic layer is less than $10^{-5}$ $g/m^2$.

* * * * *